United States Patent [19]
Lee et al.

[11] Patent Number: 5,701,262
[45] Date of Patent: Dec. 23, 1997

[54] TAB COEFFICIENT UPDATING DEVICE OF FINITE IMPULSE-RESPONDING ADAPTIVE DIGITAL FILTER

[75] Inventors: Geum Ock Lee; Gyun Seog Yang, both of Seoul, Rep. of Korea

[73] Assignee: Hyundai Electronics Industries Co., Ltd., Kyungki-Do, Rep. of Korea

[21] Appl. No.: 399,413

[22] Filed: Mar. 7, 1995

[30] Foreign Application Priority Data

Mar. 7, 1994 [KR] Rep. of Korea .................. 94-4370

[51] Int. Cl.$^6$ .................................................. G06F 17/10
[52] U.S. Cl. .................................................. 364/724.19
[58] Field of Search ........................... 364/724.19, 724.16

[56] References Cited

U.S. PATENT DOCUMENTS

| | | | |
|---|---|---|---|
| 4,939,685 | 7/1990 | Feintuch | 364/724.19 |
| 5,058,047 | 10/1991 | Chung | 364/724.19 |
| 5,168,459 | 12/1992 | Hiller | 364/724.19 |
| 5,216,629 | 6/1993 | Gurcan et al. | 364/724.19 |
| 5,243,624 | 9/1993 | Paik et al. | 364/724.19 |
| 5,329,472 | 7/1994 | Sugiyama | 364/724.19 |
| 5,353,026 | 10/1994 | Wilson | 341/143 |
| 5,392,315 | 2/1995 | Laud | 364/724.19 |
| 5,535,150 | 7/1996 | Chiang | 364/724.19 |

*Primary Examiner*—David H. Malzahn
*Attorney, Agent, or Firm*—Foley & Lardner

[57] ABSTRACT

A tab coefficient updating device of an FIRADF capable of greatly reducing the amount of hardware therefor and integrating its tab coefficient updating value operating circuit using a simple circuit design. The tab coefficient updating device includes a finite impulse-responding adaptive digital filter unit for filtering an input signal using a tab coefficient updated for a predetermined one of all tabs by a tab coefficient signal and a tab address signal, and a tab address generating unit for generating the tab address signal associated with the predetermined tab of the finite impulse-responding adaptive digital filter unit and applying the generated tab address signal to a tab coefficient updating value operating unit as well as the finite impulse-responding adaptive digital filter unit. The tab coefficient updating value operating unit serves to receive the input signal and an error signal indicative of the difference between an output signal of the finite impulse-responding adaptive digital filter unit and a requirement signal and execute an operation of an updating value for only one, of the tab coefficients, designated by the tab address signal received from the tab address generating unit on the basis of the signals received therein.

8 Claims, 8 Drawing Sheets

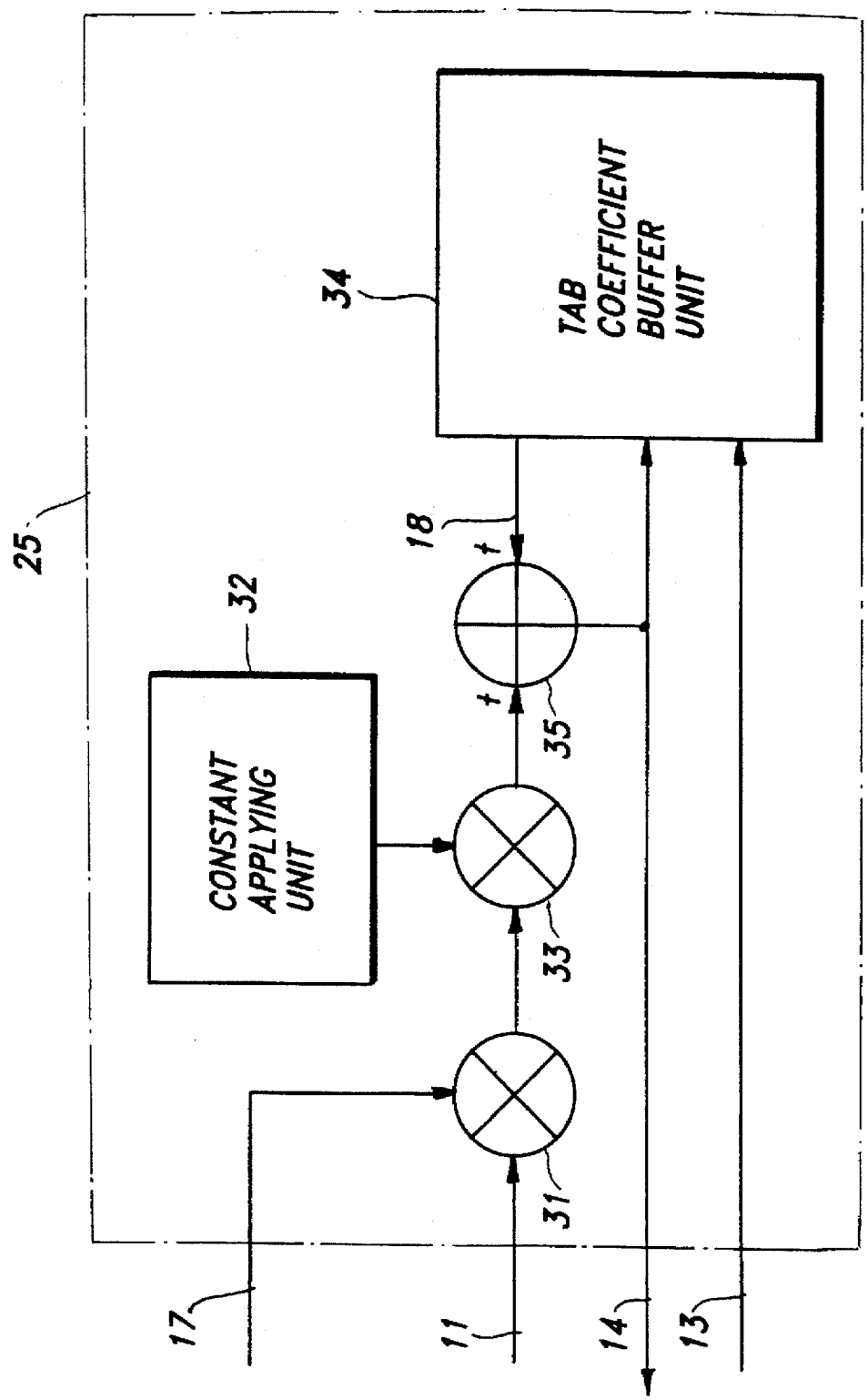

TAB COEFFICIENT UPDATING DEVICE OF FINITE IMPULSE-RESPONDING ADAPTIVE DIGITAL FILTER

BACKGROUND OF THE INVENTION

1. Field of the Invention

The present invention relates to a tab coefficient updating device used for a finite impulse-responding adaptive digital filter (FIRADF), and more particularly to a tab coefficient updating device used for a filter (e.g. an adaptive filter) gradually varying in characteristic and serving as an important unit of a receiver of a digital communication system such as noise filter or satellite broadcast receiver.

2. Description of the Related Art

In FIG. 1, there is shown a conventional FIRADF. The conventional FIRADF includes a FIRADF unit 21 for filtering an input signal 11 using tab coefficients respectively updated by tab coefficient signals 14 and tab address signals 13 inputted L+1 times at the FIRADF unit 21 and thereby generating an output signal 15. The conventional FIRADF also includes a tab coefficient updating value operating unit 22 which receives the input signal 11 and an error signal 17 indicative of the difference between the output signal 15 of FIRADF unit 21 and a requirement signal 16.

The tab coefficient updating value operating unit 22 serves to execute an operation of each tab coefficient updating value on the basis of the received signals 11 and 17 and outputs L+1 tab coefficient values as the result of the operation to a tab coefficient buffer unit 23 so that the tab coefficient values are stored in the tab coefficient buffer unit 23.

As shown in FIG. 1, a tab address generating unit 24 is coupled to the FIRADF unit 21. The tab address generating unit 24 serves to generate tab address signals respectively associated with tabs of the FIRADF unit 21 and applies the generated tab address signals to the FIRADF unit 21 and the tab coefficient buffer unit 23. The tab coefficient buffer unit 23 sends a tab coefficient value corresponding to each tab address signal 13 received therein to the FIRADF unit 21 as a tab coefficient signal 14.

A flow diagram illustrating a detailed construction of the FIRADF unit 21 is shown in FIG. 2. As shown, the FIRADF unit 21 includes a main filtering unit 100, an assistant filtering unit 200 and an adder unit 4. The main filtering unit 100 includes a tab coefficient register 2 adapted to receive each tab address signal 13 and each tab coefficient signal 14 and output a tab coefficient based on the received signals, and a multiplier 3 adapted to multiply the input signal 11 by the tab coefficient outputted from the tab coefficient register 2 and output the result of the multiplication to the adder unit 4. The assistant filtering unit 200 includes a plurality of filters (in the illustrated case, N filters) connected to one another in parallel. Each filter of the assistant filtering unit 200 includes an input signal latch (the first one and the last one are denoted by "1-1" and "1-L", respectively) adapted to receive the input signal 11 and output a latch signal (the first one and the last one are denoted by "12-1" and "12-L", respectively), a tab coefficient register (the first one and the last one is denoted by "2-1" and "2-L", respectively) adapted to receive each tab address signal 13 and each tab coefficient signal 14 and output a tab coefficient, and a multiplier (the first one and the last one are denoted by "3-1" and "3-L", respectively) adapted to multiply the latch signal by the tab coefficient outputted from the tab coefficient register and output the result of the multiplication to the adder unit 4. The adder unit 4 serves to sum signals respectively outputted from the multipliers 3, 3-1 to 3-L together and to output signal 15 as a signal obtained by filtering the input signal 11.

The operation of the conventional FIRADF having the above-described construction will now be described.

Once an input signal 11 is applied to the FIRADF 21 and the tab coefficient updating value operating unit 22, it is received in the multiplier 3 of the main filtering unit 100 of FIRADF 21 and each input signal latch of the assistant filtering unit 200 of FIRADF 21. Upon receiving the input signal 11, the multiplier 3 multiplies the input signal 11 by a tab coefficient outputted from the tab coefficient register 2 and then generates an output signal on the basis of the multiplication result. The output signal from the multiplier 3 is sent to the adder unit 4. In the case of the FIRADF 21, for example, its first input signal latch 1-1 generates a first latch signal 12-1 upon receiving the input signal 11. The first multiplier 3-1 receives the first latch signal 12-1 from the first input signal latch 1-1 and then multiplies the received first latch signal 12-1 by a tab coefficient outputted from the first tab coefficient register 2-1. On the basis of the multiplication result, the first multiplier 3-1 sends its output signal to the adder unit 4. In such a manner, all output signals of all the multipliers 3-1 to 3-L of FIRADF 21 are applied to the adder unit 4 which, in turn, sums the signals received therein together, thereby generating an output signal 15. In order to output respective tab coefficients from the tab coefficient registers 2 and 2-1 to 2-L, the FIRADF 21 receives tab coefficient signals 14 together with tab address signals 13 in a sequential manner. Each tab coefficient signal 14 received in the FIRADF 21 is recorded in each one of the tab coefficient registers 2 and 2-1 to 2-L selected by each corresponding tab address signal 13 received together with the tab coefficient signal 14. For recording new tab coefficients in all the tab coefficient registers 2 and 2-1 to 2-L, therefore, the tab coefficient signals 14 and tab address signals 13 should be inputted L+1 times.

Together with the input signal 11, the tab coefficient updating value operating unit 22 receives an error signal 17 indicative of the difference between the output signal 15 of FIRADF unit 21 and a requirement signal 16. Upon receiving the signals 11 and 17, the tab coefficient updating value operating unit 22 executes an operation of a tab coefficient updating value on the basis of the received signals 11 and 17. As the result of the operation, the tab coefficient updating value operating unit 22 outputs all of the L+1 tab coefficient values. All of the L+1 tab coefficient values are stored in the tab coefficient buffer unit 23.

The tab address generating unit 24 generates the tab address signals 13 respectively associated with the tabs of the FIRADF unit 21 and applies the generated tab address signals 13 to the FIRADF unit 21 and the tab coefficient buffer unit 23. Upon receiving each tab address signal 13, the tab coefficient buffer unit 23 sends a tab coefficient value corresponding to the tab address signal 13 to the FIRADF unit 21 as a tab coefficient signal 14. In such a manner, all tab coefficients of the FIRADF unit 21 are updated. Filtering of the input signal 11 and outputting of a new output signal 15 are achieved for the first time only after completing the update of all tab coefficients. Thus, an adaptive digital filtering operation is achieved in such a manner.

The operation principle of the FIRADF using the least mean square (LMS) algorithm as its adaptive algorithm will now be described.

The output signal 15 of the equalizer corresponding the K-th symbol can be expressed by the following equation (1):

$$Y_k = \sum_{j=0}^{L} W_j X_{k-j} = X_k^T W_k \qquad (1)$$

where, $X_k$ represents the vector expression of the input signal 11 while $W_k$ represents the vector expression of the tab coefficient of the FIRADF.

The output error of an FIRADF having L+1 tabs can be derived by the following equation (2):

$$\epsilon_k = D_k - Y_k = D_k - X_k^T W_k \qquad (2)$$

In order to develop the adaptive algorithm, the difference between mean values of approximate errors, namely, $E[\epsilon_k^2]$ is defined as a cost function. For minimizing the difference, the gradient of the cost function should be estimated. In the case of the LMS algorithm, however, "$\epsilon_k^2$" is utilized in place of "$E[\epsilon_k^2]$".

For every processing of adaptive algorithm, the following gradient estimation is made:

$$\nabla_k = \partial \epsilon_k / \partial W_k = 2\epsilon_k(\partial \epsilon_k / \partial W_k) = -2\epsilon_k X_k \qquad (3)$$

The above relation can be easily understood from the equation (2).

This simple gradient estimation can be applied to an adaptive algorithm of the steepest-descent type as follows:

$$\begin{aligned} W_{k+1} &= W_k - \mu \nabla_k \qquad (4) \\ &= W_k + 2\mu \epsilon_k X_k \end{aligned}$$

As described above, the tab coefficient updating unit of the conventional FIRADF updates tab coefficient values for respective tabs in a sequential manner due to a problem inherent in the integrated structure of the FIRADF. In other words, the tab coefficient updating unit do not update the tab coefficients for all tabs at one time. On the other hand, the tab coefficient updating value operating unit executes an operation of all tab coefficient updating values of the FIRADF at one time. Therefore, one problem associated with updating tab coefficients in the conventional FIRADF is that its circuitry is complicated unnecessarily.

SUMMARY OF THE INVENTION

Therefore, an object of the invention is to provide a tab coefficient updating device of an FIRADF which has simpler circuitry and is capable of operating only one tab coefficient to be currently updated among tab coefficients being sequentially updated, and then sequentially updating all tab coefficient updating values.

In accordance with the present invention, this object can be accomplished by providing a tab coefficient updating device of a finite impulse-responding adaptive digital filter, comprising a finite impulse-responding adaptive digital filter unit for filtering an input signal using a tab coefficient updated for a predetermined one of all tabs thereof by a tab coefficient signal and a tab address signal received therein; a tab address generating unit for generating the tab address signal associated with the predetermined tab of the finite impulse-responding adaptive digital filter unit and applying the generated tab address signal to a tab coefficient updating value operating unit as well as the finite impulse-responding adaptive digital filter unit. The tab coefficient updating value operating unit receives the input signal and an error signal indicative of the difference between an output signal of the finite impulse-responding adaptive digital filter unit and a requirement signal and executes an operation of an updating value for only one of the tab coefficients, designated by the tab address signal received from the tab address generating unit on the basis of the signals received therein.

The tab coefficient updating value operating unit may comprise a first multiplier for multiplying the input signal and the error signal together, a constant applying unit for determining a constant to be outputted, a second multiplier for multiplying an output signal of the first multiplier by the constant outputted from the constant applying unit, and an adder for adding the signal outputted from the second multiplier to a current tab coefficient signal outputted from a tab coefficient buffer unit and outputting the resultant signal as the tab coefficient signal. The tab coefficient buffer unit records the tab coefficient signal outputted from the adder and sends the current tab coefficient signal to the adder.

The tab coefficient updating value operating unit may comprise a processor that receives the input signal and the error signal, calculates a tab coefficient updating value on the basis of the received signals, and outputs a tab coefficient signal under a control of an interrupt signal outputted from an interrupt generating unit. The interrupt generating unit receives a tab address signal and in response sends an interrupt signal to allow the processor to output the tab coefficient updating value.

The tab coefficient updating value operating unit comprises a first multiplier for multiplying the input signal and the error signal together, a constant applying unit for determining a constant to be outputted, a second multiplier for multiplying an output signal of the first multiplier by the constant outputted from the constant applying unit, a memory unit for recording the input signal, the error signal and an output signal of the second multiplier indicative of the product of the input signal, error signal and constant sent from the constant applying unit and outputting the stored product upon receiving a next input signal and a next error signal, an adder for adding an output signal of the memory unit to a current tab coefficient signal outputted from a tab coefficient buffer unit and outputting the resultant signal as the tab coefficient signal, and the tab coefficient buffer unit for recording the tab coefficient signal outputted from the adder and sending the current tab coefficient signal to the adder upon receiving the tab address signal.

The tab coefficient buffer unit comprises a random access memory (RAM) unit adapted to receive the tab address signal, preferentially read a tab coefficient corresponding to the tab address signal under a control of a control signal for controlling inputting and outputting operations of the RAM, then output a current tab coefficient signal, and record the tab coefficient signal outputted from the adder.

The tab coefficient buffer unit comprises a reset signal generating unit adapted to receive the tab address signal exhibiting a periodically repetitive characteristic due to the fixed number of tabs of the finite impulse-responding adaptive digital filter and generate a pulse at predetermined intervals as a reset signal, and a first-in first-out (FIFO) memory unit adapted to receive the reset signal generated from the reset signal generating unit and a control signal, output a current tab coefficient signal to the adder in response to the receipt of the signals, and record the tab coefficient signal outputted from the adder.

BRIEF DESCRIPTION OF THE DRAWINGS

The accompanying drawings, which are incorporated in and constitute a part of the specification, illustrate presently preferred exemplary embodiments of the invention and, together with the general description given above and the detailed description of the preferred embodiments given below, serve to explain the principles of the invention.

Other objects, advantages and aspects of the instant invention will become apparent from the following description of embodiments with reference to the accompanying drawings in which:

FIG. 3 is a block diagram showing an FIRADF in accordance with the present invention;

FIG. 4 is a flow diagram showing a tab coefficient updating value operating unit of the FIRADF shown in FIG. 3 in accordance with an embodiment of the present invention;

DETAILED DESCRIPTION OF THE PREFERRED EMBODIMENTS

Figure 1:
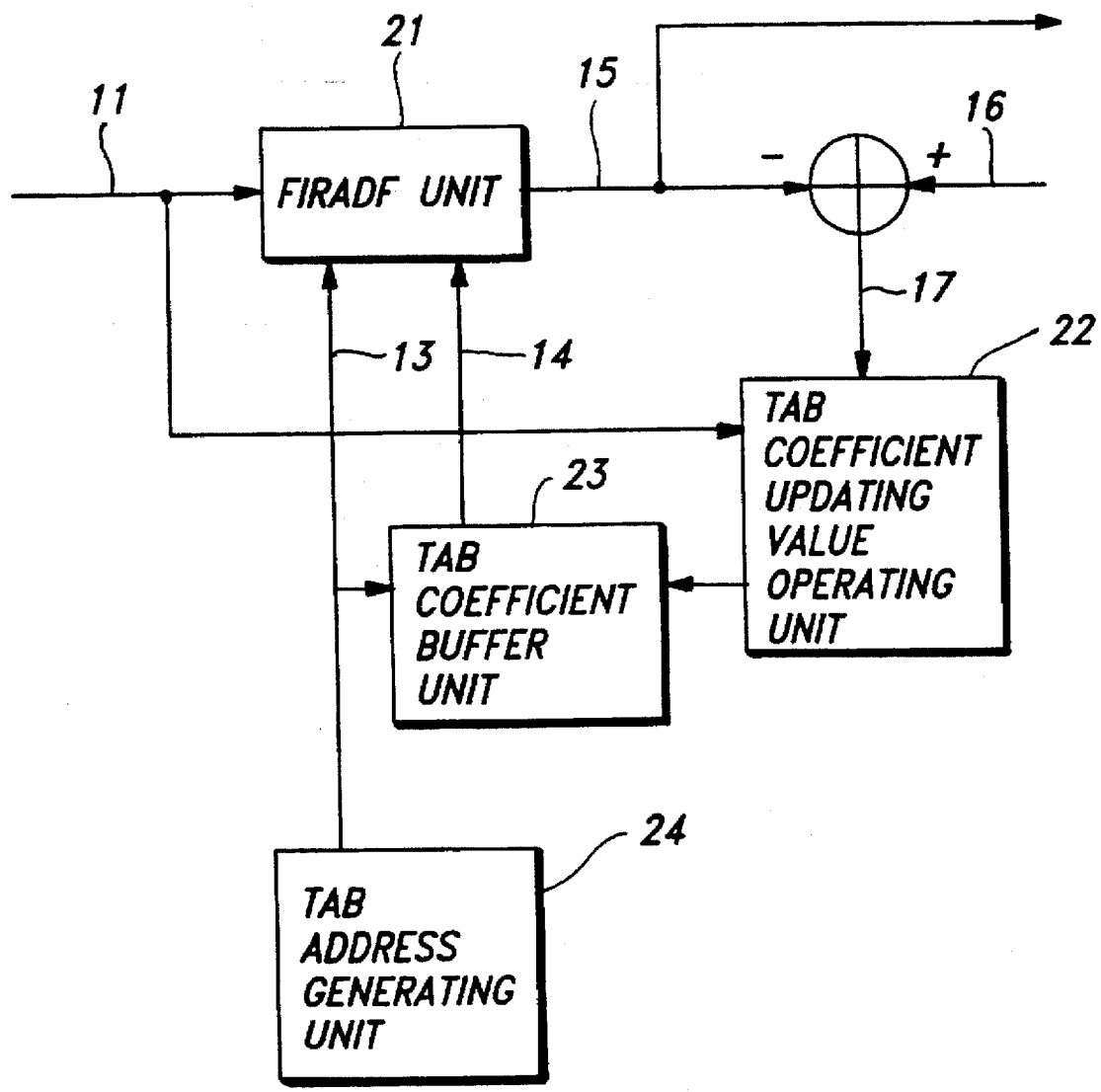
FIG. 1 is a block diagram showing a conventional FIRADF.
Figure 2:
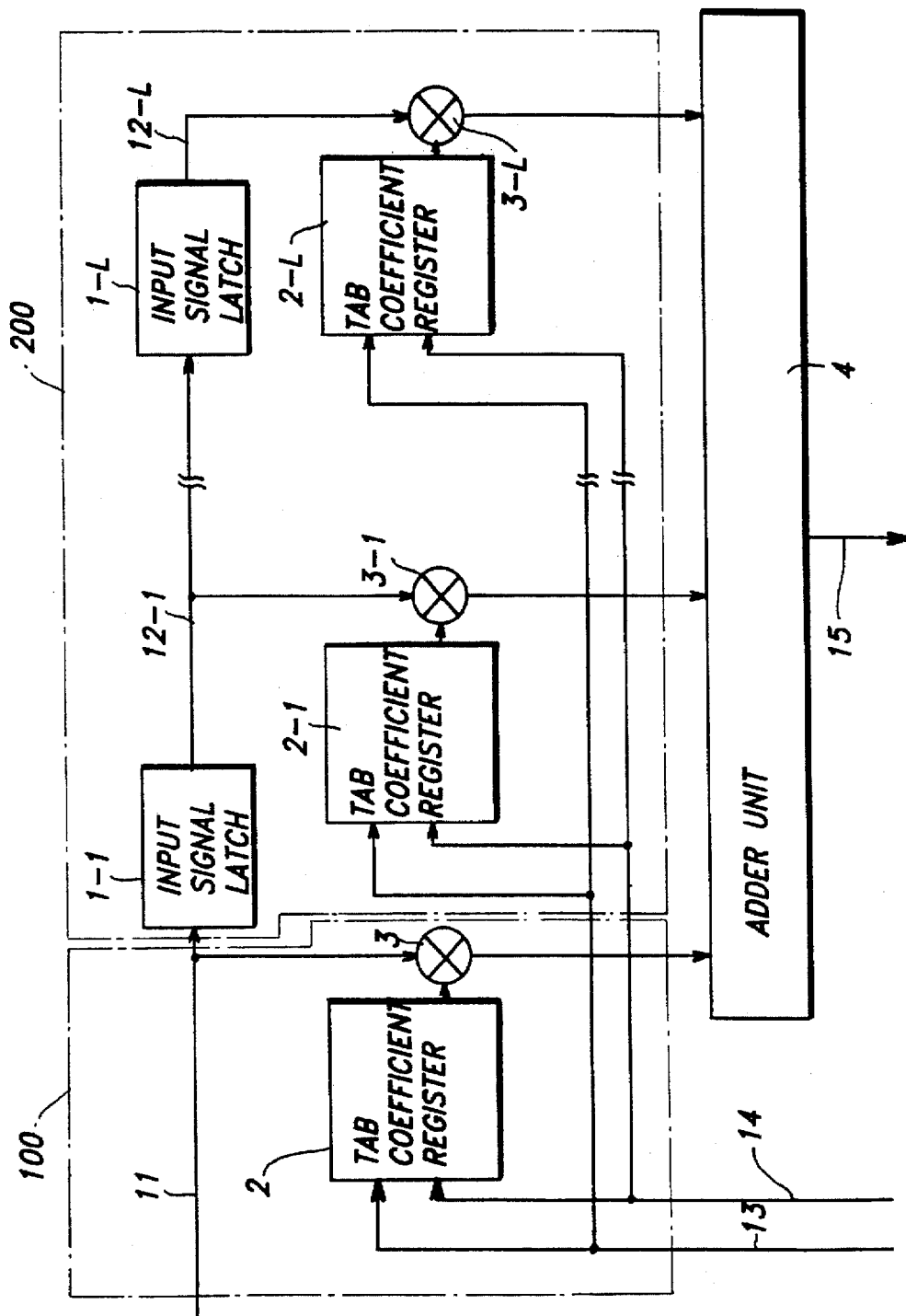
FIG. 2 is a block diagram showing a conventional FIRADF unit.
Figure 2:
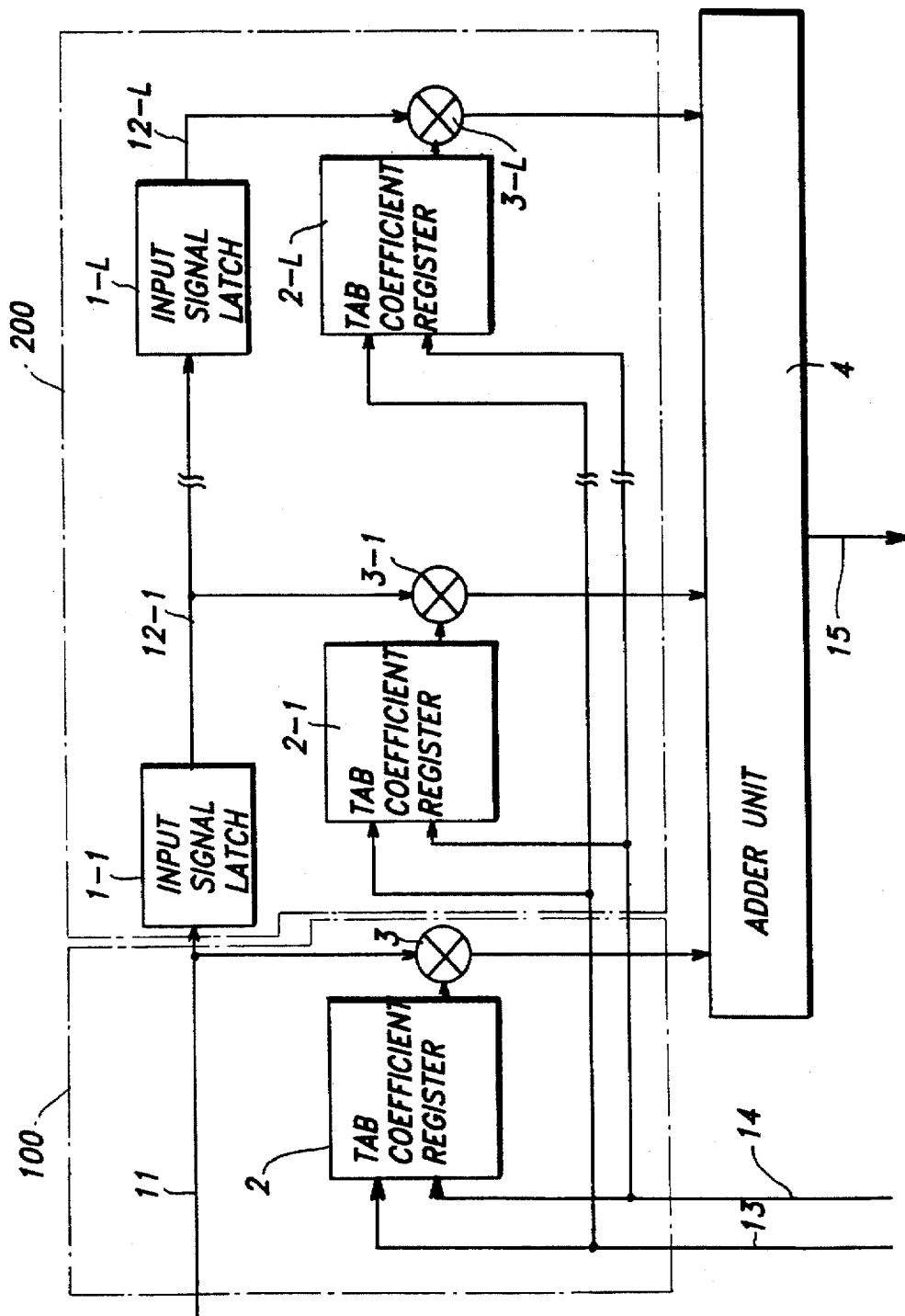

Referring to FIG. 3, there is illustrated a FIRADF in accordance with the present invention. In FIG. 3, elements which correspond to those in FIG. 1 are denoted by the same reference numerals. As shown in FIG. 3, the FIRADF includes a FIRADF unit 21 for filtering an input signal 11 using a tab coefficient updated for a predetermined one of L+1 tabs thereof by a tab coefficient signal 14 and a tab address signal 13 and for generating an output signal 15. The FIRADF also includes a tab address generating unit 24 for generating the tab address signal 13 associated with the predetermined tab of the FIRADF unit 21 and applying the generated tab address signal 13 to a tab coefficient updating value operating unit 25 as well as the FIRADF unit 21. The tab coefficient updating value operating unit 25, which constitutes a part of the FIRADF, receives the input signal 11 and an error signal 17 indicative of the difference between the output signal 15 of the FIRADF unit 21 and a requirement signal 16 and executes an operation of an updating value for only one of the tab coefficients, designated by the tab address signal 13 received from the tab address generating unit 24, on the basis of the received signals 11 and 17.

FIG. 4 is a flow diagram illustrating a detailed construction of the tab coefficient updating value operating unit 25 in accordance with an embodiment of the present invention. As shown in FIG. 4, the tab coefficient updating value operating unit 25 includes a first multiplier for multiplying the input signal 11 by the error signal 17 and outputting the resultant signal, a constant applying unit 32 for determining a constant to be outputted, a second multiplier 33 for multiplying the signal outputted from the first multiplier 31 by the constant outputted from the constant applying unit 32 and outputting the resultant signal, and an adder 35 for adding the signal outputted from the second multiplier 33 to a current tab coefficient signal 18 outputted from a tab coefficient buffer unit 34 and outputting the resultant signal as the tab coefficient signal 14. The tab coefficient buffer unit 34, which constitutes a part of the tab coefficient updating value operating unit 25, serves to record the tab coefficient signal 14 outputted from the adder 35 and send the current tab coefficient signal 18 to the adder 35.

Operation of the FIRADF having the above-mentioned construction in accordance with the present invention will now be described.

Once an input signal 11 is applied to the FIRADF unit 21 and the tab coefficient updating value operating unit 25, the FIRADF unit 21 filters the received input signal 11 using a tab coefficient updated for a predetermined one of L+1 tabs by a tab coefficient signal 14 outputted from the adder 35 and a tab address signal 13 outputted from the tab address generating unit 24 and thereby generates an output signal 15.

On the other hand, the input signal received in the tab coefficient updating value operating unit 25 is multiplied by an error signal 17 received in the tab coefficient updating value operating unit 25. The tab coefficient updating value operating unit 25 also multiplies the resultant signal obtained by the above multiplication by a constant determined in the constant applying unit 32 and outputs the resultant signal to the adder 35. Meanwhile, the tab coefficient buffer unit 34 sends a current tab coefficient signal 18 associated with a location designated by the tab address signal 13 to the adder 35 and newly records the tab coefficient signal 14 outputted from the adder 35 in the designated location. The adder 35 adds the current tab coefficient signal 18 outputted from the tab coefficient buffer unit 34 to the product of the input signal 11, error signal 17 and the constant and generates an updated tab coefficient which is, in turn, sent to the tab coefficient buffer unit 34. The updated tab coefficient from the adder 35 is also outputted as the tab coefficient signal 14. Through the above procedure, the operation of one tab coefficient updating value is carried out one at a time.

The tab address generating unit 24 generates the tab address signal 13 associated with the predetermined tab of the FIRADF unit 21 and applies the generated tab address signal 13 to the tab coefficient updating value operating unit 25 as well as the FIRADF unit 21. After completing the updating of tab coefficient in the FIRADF unit 21, the filtering of the input signal 11 and the outputting of new output signal 15 is achieved. Thus, an adaptive digital filtering operation is achieved by updating only one tab coefficient in one adaptive operation in the above-mentioned manner.

Figure 5:
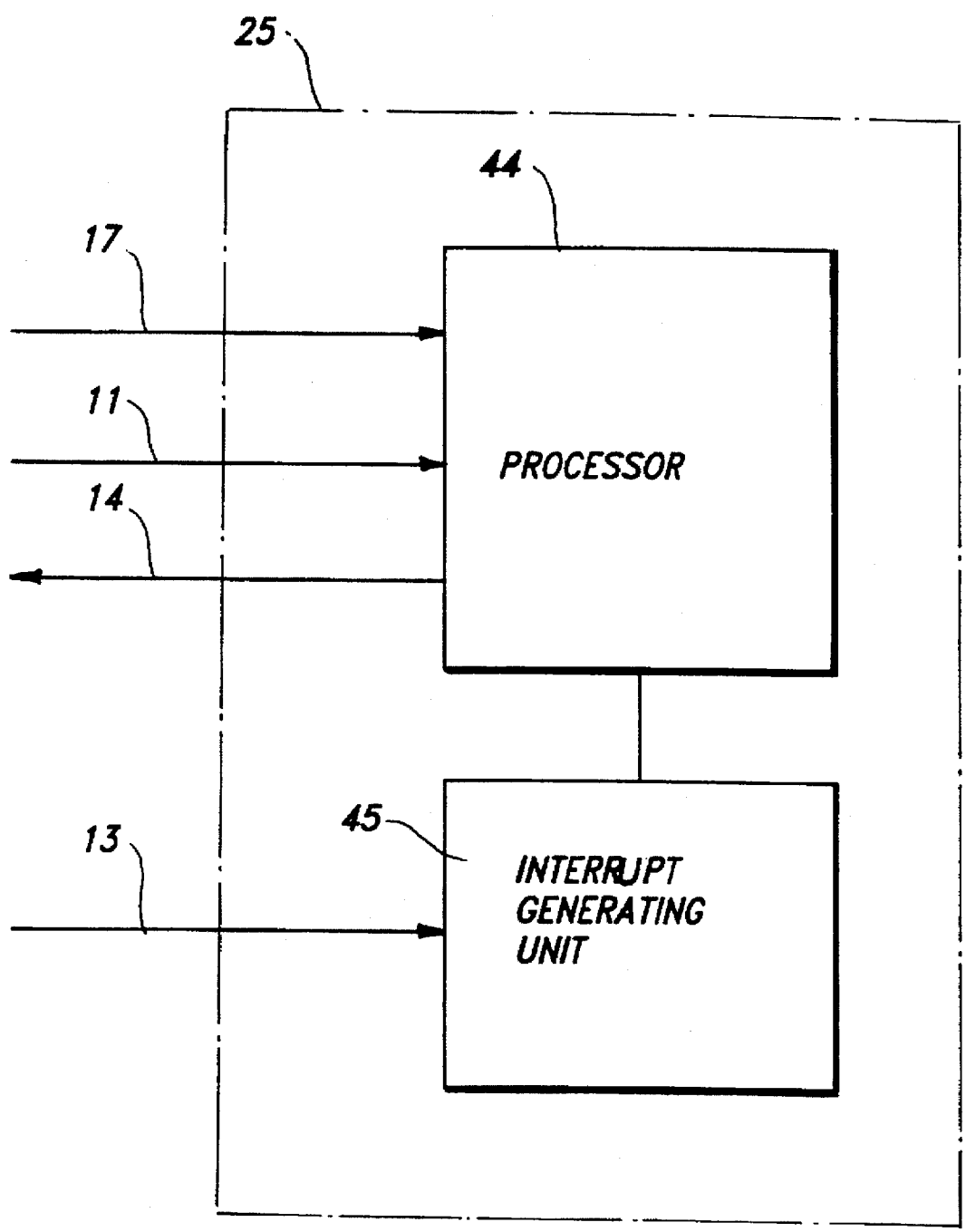
FIG. 5 is a flow diagram showing a tab coefficient updating value operating unit of the FIRADF shown in FIG. 3 in accordance with another embodiment of the present invention.

FIG. 5 is a flow diagram illustrating a detailed construction of the tab coefficient updating value operating unit 25 in accordance with another embodiment of the present invention. As shown in FIG. 5, the tab coefficient updating value operating unit 25 includes a processor 44 for receiving the input signal 11 and the error signal 17, calculating a tab coefficient updating value on the basis of the received signals 11 and 17, and outputting a tab coefficient signal 14 under a control of an interrupt signal outputted from an interrupt generating unit 45. The interrupt generating unit 45, which also constitutes a part of the tab coefficient updating value operating unit 25, serves to receive the tab address signal 13 and thereby to send the interrupt signal for allowing the processor 44 to output the tab coefficient updating value.

In the tab coefficient updating value operating unit 25 having the above construction, the processor 44 calculates a tab coefficient updating value upon receiving the input signal 11 and the error signal 17 and outputs a tab coefficient signal 14 in response to an interrupt signal received from the interrupt generating unit 45. The interrupt generating unit 45 sends the interrupt signal for allowing the processor 44 to output the tab coefficient updating value upon receiving the tab address signal 13.

Figure 6:
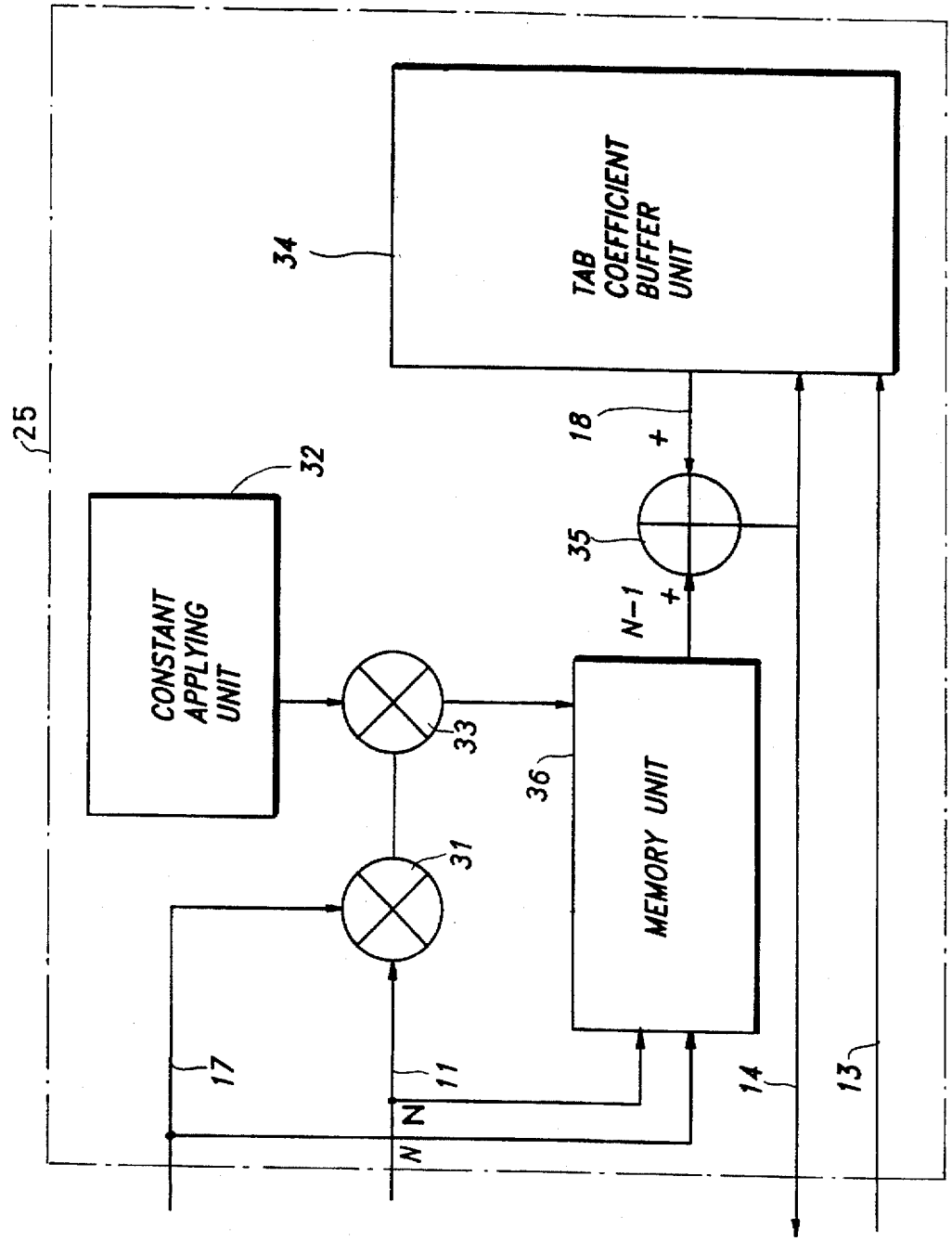
FIG. 6 is a flow diagram showing a tab coefficient updating value operating unit of the FIRADF shown in FIG. 3 in accordance with another embodiment of the present invention.

FIG. 6 is a flow diagram illustrating a detailed construction of the tab coefficient updating value operating unit 25 in accordance with another embodiment of the present invention. In FIG. 6, elements which correspond to those in FIG. 4 are denoted by the same reference numerals. As shown in FIG. 6, the tab coefficient updating value operating unit 25 includes a first multiplier 31 for multiplying the input signal 11 and the error signal 17 together and outputting the resultant signal, a constant applying unit 32 for determining a constant to be outputted, and a second multiplier 33 for multiplying the signal outputted from the first multiplier 31 by the constant outputted from the constant applying unit 32 and outputting the resultant signal. The tab coefficient updating value operating unit 25 further includes a memory unit 36 for recording the input signal 11 (in FIG. 6, the N-1-th signal), the error signal 17 (in FIG. 6, the N-1-th signal) and the output signal (in FIG. 6, the N-1-th signal) of the second multiplier 33 indicative of the product (in FIG. 6, the N-1-th product) of the input signal 11, error signal 17 and the constant sent from the constant applying unit 32 and outputting the stored product (in FIG. 6, the N-1-th product) upon receiving a next input signal 11 (in FIG. 6, the N-th signal) and a next error signal 17 (in FIG. 6, the N-th signal), and an adder 35 for adding the signal outputted from the memory unit 36 to a current tab coefficient signal 18 outputted from a tab coefficient buffer unit 34 and outputting the resultant signal as the tab coefficient signal 14. The tab coefficient buffer unit 34, which also constitutes a part of the tab coefficient updating value operating unit 25, serves to record the tab coefficient signal 14 outputted from the adder 35 and to send the current tab coefficient signal 18 to the adder 35 upon receiving the tab address signal 13.

In the tab coefficient updating value operating unit 25 having the above construction, the memory unit 36 records the input signal 11, the error signal 17 and the output signal of the second multiplier 33 indicative of the product of the input signal 11, error signal 17 and the constant sent from the constant applying unit 32. Upon receiving a next input signal 11 and a next error signal 17, the memory unit 36 outputs the stored product to the adder 35. In the adder 35, the output signal of the memory unit 36 is added to the current tab coefficient signal 18 received in the adder 35 from the tab coefficient buffer unit 34. The resultant signal outputted from the adder 35 is then recorded in the tab coefficient buffer unit 34 which, in turn, operates to output the received signal as the tab coefficient signal 14.

Figure 7:
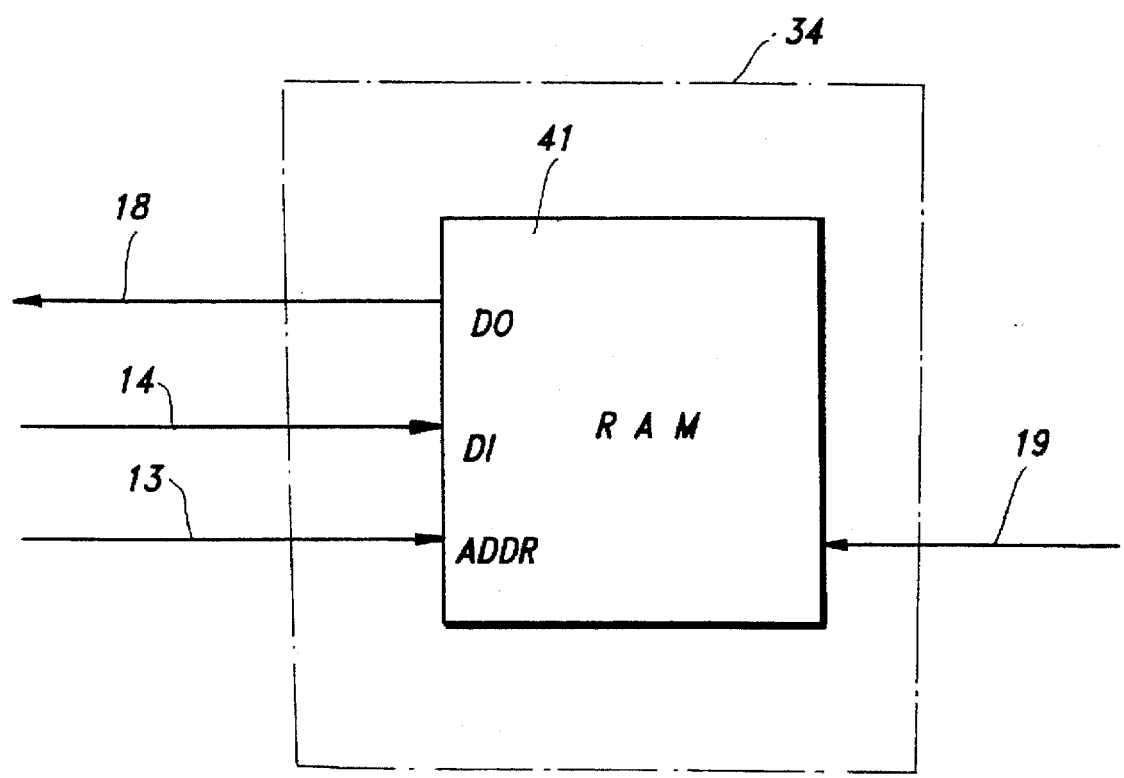
FIG. 7 is a block diagram showing a tab coefficient buffer unit of the tab coefficient updating value operating unit shown in FIG. 4 or FIG. 6 in accordance with another embodiment of the present invention.

FIG. 7 is a block diagram illustrating a detailed construction of the tab coefficient buffer unit 34 of the tab coefficient updating value operating unit 25 shown in FIG. 4 or FIG. 6 in accordance with an embodiment of the present invention. The tab coefficient buffer unit 34 comprises a RAM 41 adapted to receive the tab address signal 13, to preferentially read a tab coefficient corresponding to the tab address signal 13 under a control of a control signal 19 for controlling inputting and outputting operations of the RAM 41, to then output a current tab coefficient signal 18 and to record the tab coefficient signal 14 outputted from the adder 35.

In the tab coefficient buffer unit 34 having the above construction, the RAM 41 receives the tab address signal 13 at its input port DO and preferentially reads a tab coefficient corresponding to the tab address signal 13 received at its input port ADDR under a control of a control signal 19 for controlling inputting and outputting operations of the RAM 41. Then, the RAM 41 records the tab coefficient signal 14 from the adder 35 received at its input port DI.

Figure 8:
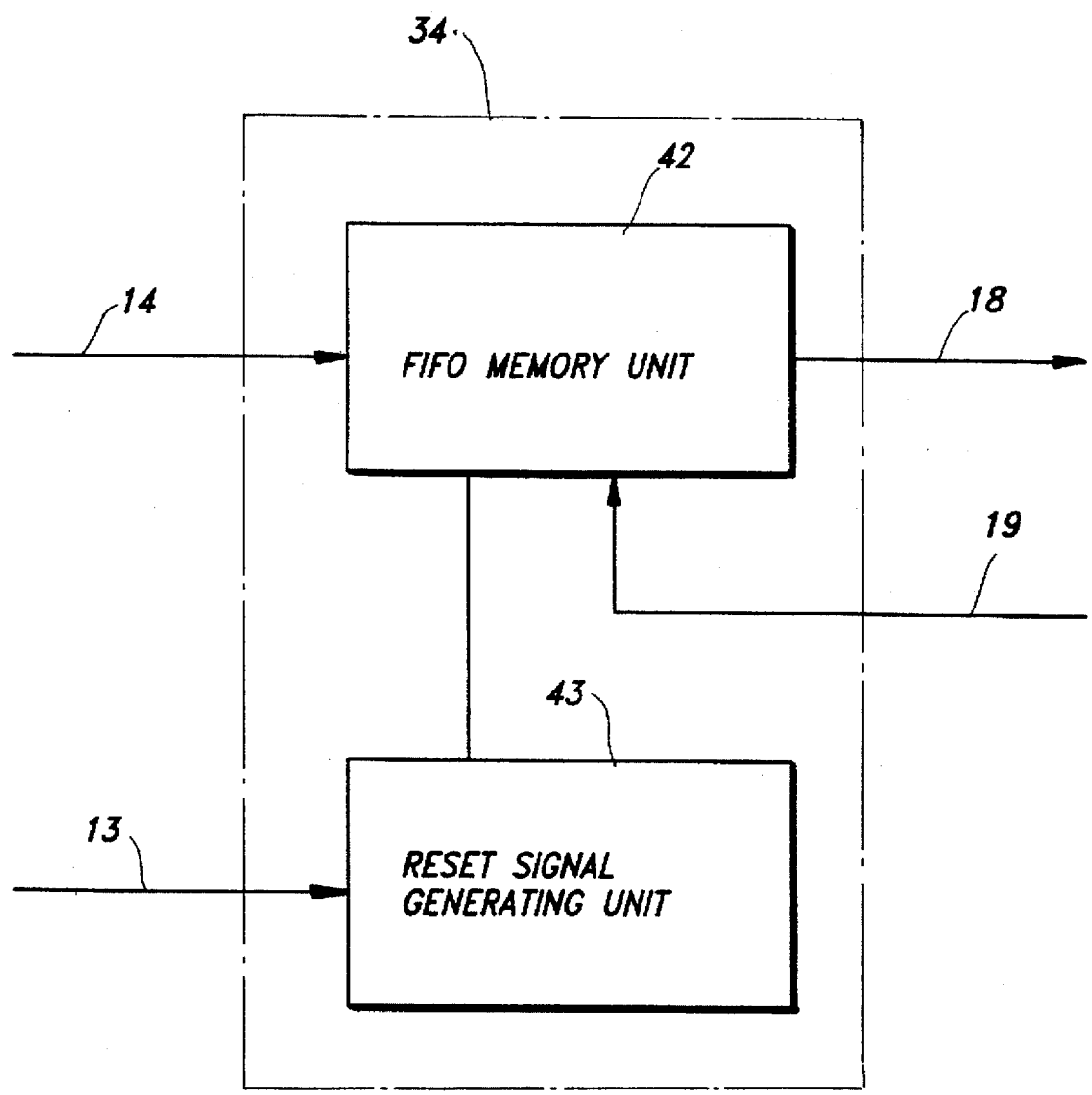
FIG. 8 is a block diagram showing a tab coefficient buffer unit of the tab coefficient updating value operating unit shown in FIG. 4 or FIG. 6 in accordance with another embodiment of the present invention.

FIG. 8 is a block diagram illustrating a detailed construction of the tab coefficient buffer unit 34 of the tab coefficient updating value operating unit 25 shown in FIG. 4 or FIG. 6 in accordance with another embodiment of the present invention. The tab coefficient buffer unit 34 comprises a reset signal generating unit 43 adapted to receive the tab address signal 13 exhibiting a periodically repetitive characteristic due to the fixed number of tabs of the FIRADF unit 21 and to generate a pulse at predetermined intervals as a reset signal, and a first-in first-out (FIFO) memory unit 42 adapted to receive the reset signal generated from the reset signal generating unit 43 and a control signal 19, to output a current tab coefficient signal 18 to the adder 35 in response to the receipt of the signals, and to record the tab coefficient signal 14 outputted from the adder 35.

Since the number of tabs of the FIRADF unit 21 is fixed, the tab address signal 13 exhibits a periodically repetitive characteristic. By utilizing such a characteristic of the tab address signal 13, the reset signal generating unit 43 generates a pulse at predetermined intervals and thereby controls the FIFO memory unit 42 to output the current tab coefficient signal 18 and to record the output signal 14 from the adder 35 therein.

As apparent from the above description, the present invention provides a tab coefficient updating device of an FIRADF capable of greatly reducing the amount of hardware therefor and integrating its tab coefficient updating value operating circuit using a simple circuit design.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A finite impulse-responding adaptive digital filter system, comprising:

a finite impulse-responding adaptive digital filter unit for filtering an input signal using a tab address signal and a tab coefficient signal, wherein the tab coefficient signal has been updated for a predetermined tab of a plurality of tabs;

a tab address generating unit for generating the tab address signal associated with the predetermined tab of the finite impulse-responding adaptive digital filter unit; and a tab coefficient updating value operating unit for receiving the tab address signal, the input signal and an error signal indicative of a difference between an output signal of the finite impulse-responding adaptive digital filter unit and a requirement signal, and for executing an operation of updating the tab coefficient signal designated by the tab address signal.

2. A finite impulse-responding adaptive digital filter system in accordance with claim 1, wherein the tab coefficient updating value operating unit comprises:

a first multiplier for multiplying the input signal and the error signal together;

a constant applying unit for determining a constant to be outputted;

a second multiplier for multiplying an output signal of the first multiplier by the constant outputted from the constant applying unit;

an adder for adding an output signal of the second multiplier and a current tab coefficient signal and for outputting the tab coefficient signal; and a tab coefficient buffer unit for recording the tab coefficient signal outputted from the adder and sending the current tab coefficient signal to the adder.

3. A finite impulse-responding adaptive digital filter system in accordance with claim 2, wherein the tab coefficient buffer unit comprises:

a RAM for receiving the tab address signal, for reading a tab coefficient corresponding to the tab address signal, for outputting the current tab coefficient signal, and for recording the tab coefficient signal outputted from the adder, wherein the RAM includes input and output operations governed by a control signal.

4. A finite impulse-responding adaptive digital filter system in accordance with claim 2, wherein the tab coefficient buffer unit comprises:

a reset signal generating unit for receiving the tab address signal, wherein the tab address signal exhibits a periodically repetitive characteristic due to a fixed number of tabs in the finite impulse-responding adaptive digital filter unit and for generating a reset signal at predetermined intervals; and a first-in first-out memory unit for receiving the reset signal and a control signal, for outputting the current tab coefficient signal to the adder in response to receipt of the reset and the control signal, and to record the tab coefficient signal outputted from the adder.

5. A finite impulse-responding adaptive digital filter system in accordance with claim 1, wherein the tab coefficient updating value operating unit comprises:

a processor for receiving the input signal and the error signal, for calculating a tab coefficient updating value, and outputting the tab coefficient signal governed by an interrupt signal; and an interrupt generating unit for receiving the tab address signal and sending the interrupt signal for allowing the processor to output the tab coefficient signal.

6. A finite impulse-responding adaptive digital filter system in accordance with claim 1, wherein the tab coefficient updating value operating unit comprises:

a first multiplier for multiplying the input signal and the error signal together;

a constant applying unit for determining a constant to be outputted;

a second multiplier for multiplying an output signal of the first multiplier by the constant outputted from the constant applying unit;

a memory unit for recording the input signal, the error signal and an output signal of the second multiplier and for outputting the output signal of the second multiplier upon receiving a next input signal and a next error signal;

an adder for adding an output signal of the memory unit and a current tab coefficient signal and for outputting the tab coefficient signal; and a tab coefficient buffer unit for recording the tab coefficient signal, receiving the tab address signal and sending the current tab coefficient signal to the adder upon receipt of the tab address signal.

7. A finite impulse-responding adaptive digital filter system in accordance with claim 6, wherein the tab coefficient buffer unit comprises:

a RAM for receiving the tab address signal, for reading a tab coefficient corresponding to the tab address signal, for outputting the current tab coefficient signal, and for recording the tab coefficient signal outputted from the adder, wherein the RAM includes input and output operations governed by a control signal.

8. A finite impulse-responding adaptive digital filter system in accordance with claim 6, wherein the tab coefficient buffer unit comprises:

a reset signal generating unit for receiving the tab address signal, wherein the tab address signal exhibits a periodically repetitive characteristic due to a fixed number of tabs in the finite impulse-responding adaptive digital filter unit and for generating a reset signal at predetermined intervals; and a first-in first-out memory unit for receiving the reset signal and a control signal, for outputting the current tab coefficient signal to the adder in response to receipt of the reset and the control signal, and to record the tab coefficient signal outputted from the adder.

* * * * *